US006845812B2

United States Patent
Turocy et al.

(10) Patent No.: US 6,845,812 B2
(45) Date of Patent: Jan. 25, 2005

(54) HEATSINK WITH MULTIPLE, SELECTABLE FIN DENSITIES

(75) Inventors: James Turocy, Arlington Heights, IL (US); Robert Widmayer, Harvard, IL (US)

(73) Assignee: Motorola, Inc., Schaumburg, IL (US)

( * ) Notice: Subject to any disclaimer, the term of this patent is extended or adjusted under 35 U.S.C. 154(b) by 20 days.

(21) Appl. No.: 10/325,115

(22) Filed: Dec. 20, 2002

(65) Prior Publication Data

US 2004/0118550 A1 Jun. 24, 2004

(51) Int. Cl.[7] .................................................. H05K 7/20
(52) U.S. Cl. ....................... 165/80.3; 165/185; 361/704
(58) Field of Search .............................. 165/80.3, 185; 361/704, 710; 257/719, 722; 174/16.3

(56) References Cited

U.S. PATENT DOCUMENTS 5,038,858 A * 8/1991 Jordan et al. ................ 165/185
5,901,039 A * 5/1999 Dehaine et al. ............. 361/704
5,937,517 A * 8/1999 Smith et al. ............. 29/890.03
6,009,937 A * 1/2000 Gonner et al. ............... 165/185
6,554,060 B2 * 4/2003 Noda et al. ................ 165/80.3

FOREIGN PATENT DOCUMENTS

EP             789396 A2 * 12/1996     ......... H01L/23/367

* cited by examiner

Primary Examiner—Allen Flanigan
(74) Attorney, Agent, or Firm—Valerie M. Davis

(57) ABSTRACT

A heat sink (100) for use with a heat generating device, that includes: a base member (110); a fixed set of adjacent heat dissipating surfaces (120) formed in the base member (110) for causing the heat sink (100) to have a predetermined low power dissipation level that is a function of the number of heat dissipating surfaces (120) in the fixed set; and at least one groove (130) formed in the base member (110) between each two adjacent heat dissipating surfaces (120) in the fixed set for enabling an additional heat dissipating surface to be securely attached to the base member (110) in each groove (130) for enabling the heat sink to have a power dissipation level that is in excess of the predetermined low power dissipation level as a function of the number of additional heat dissipating surfaces attached to the base member (110).

6 Claims, 1 Drawing Sheet

HEATSINK WITH MULTIPLE, SELECTABLE FIN DENSITIES

FIELD OF THE INVENTION

The present invention relates generally to heat sinks and more specifically to a heat sink that is manufactured from a single die casting tool but that can be configured for a range of power dissipation levels.

BACKGROUND OF THE INVENTION

Radio communication systems that provide cellular and land mobile communication services are known in the art. Such systems comprise infrastructure equipment, which include equipment located at one or more sites, and subscriber units, which include portable and mobile communication units. Typically, a variety of equipment is required at each site. Such equipment includes radio base stations that support communication channels. A base station includes a receiver and a transmitter, where the transmitter uses one or more power amplifiers ("PAs") to amplify the signal before transmission. This amplification generates a significant amount of heat during operation due to the internal components of the transmitter. In many cases, if left uncontrolled, the heat generated can permanently damage these internal components.

To maintain a desirable operating temperature of the transmitter, it can be cooled in a variety of ways. One widely used method is forced air cooling, where the heat generating devices of the transmitter are mounted on a heat sink that comprises a mass of thermally conductive material, such as aluminum. The heat sink typically includes a base member and a plurality of heat dissipating surfaces (or fins), either formed on the base member or bonded into grooves formed in the base member. Then forced air is provided by a fan located adjacent to the heat sink. The heat generated by the device is conducted to the heat sink, wherein the air flow from the fan dissipates the heat to the ambient air. Relative to other methods of cooling, such as liquid cooling, forced-air cooling offers an economical solution that is relatively easy to incorporate in the design and manufacture of a base station.

Power amplifiers can have varying power output levels depending upon the desired transmit power of the transmitter, and heat sinks may be constructed to handle these varying power output levels. The ability of a heat sink to dissipate heat, i.e., its power dissipation level, is proportional to its fin density (i.e., number of fins per inch), wherein heat sinks with a greater fin density have a higher power dissipation level. However the cost of a single casting tool, e.g., approximately $130,000, typically prohibits having multiple casting tools to manufacture heat sinks of varying power dissipation levels. Therefore, a single casting tool is typically used to accommodate the varying power levels of PAs. This is typically done in one of two ways.

First, a casting tool may be used to manufacture a heat sink having a fixed fin density, which can accommodate a maximum power dissipation level as a function of the number of fins per inch formed on the base member. The resultant heat sinks are then used across the board from low to high power applications. However, a shortcoming of this technique is its lack of flexibility. More specifically, low power PAs are burdened with the weight and cost of heat sinks having additional unneeded fins, and these additional unneeded fins cause higher back pressures in the air flow system, thus, requiring higher performance and more costly fans. Moreover, the casting process limits the fin density possible and, thus, the maximum power dissipation level possible for heat sinks used with the higher power PAs.

Alternatively, a casting tool may be used to manufacture a heat sink that has no fins formed on it, but that has a predetermined number of equidistant grooves formed in a base member. Fins may then be bonded into the grooves for causing the heat sink to have a power dissipation level that is a function of the number of fins bonded thereon. A shortcoming of this technique is that all of the fins must be bonded onto the base member by hand, which significantly increases the cost to manufacture heat sinks at any power dissipation level using this technique.

Thus, there exists a need for a heat sink architecture that has a predetermined number of fixed fins formed in the base member for a low power dissipation level and a predetermined number of grooves formed in the base member for bonding in additional fins for higher power dissipation levels, thereby, reducing tooling costs and the overall cost of manufacturing heat sinks over a range of power dissipation levels.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
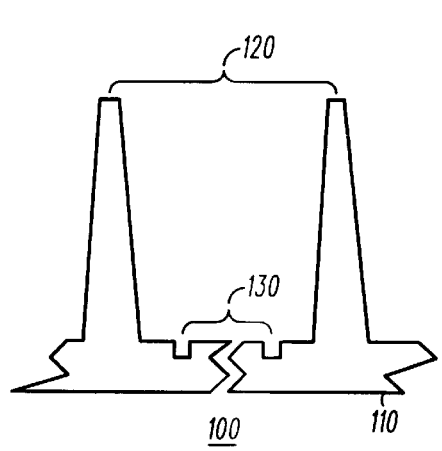
FIG. 1 illustrates a cross-sectional view of a heat sink in accordance with one embodiment of the present invention having a predetermined low power dissipation level.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

FIG. 1 illustrates a cross-sectional view of a heat sink architecture 100 in accordance with a preferred embodiment of the present invention. Heat sink 100 includes a base member 110 and heat dissipating surfaces (or fins) 120 (hereinafter referred to as fixed fins) formed in the base member 110 and having a height that corresponds to the desired application for the heat sink. Heat sink 100 also includes at least one groove 130 formed in the base member 110 between each two adjacent fins 130, each groove for enabling an additional fin to be attached (hereinafter referred to as an attached fin) to the base member 110 in the groove using one of a number of bonding methods known in the art. Heat sink 100 is shown as having two fins 120 and two grooves 130 merely for ease of illustration. However, it is preferred that heat sink 100 have a plurality of fixed fins 120 and a plurality of grooves 130 that are preferably equidistantly spaced.

The spacing between each two adjacent fixed fins is preferably equidistant and typically about 0.75 inch to 1.25 inch for causing the heat sink to have a desired predetermined low power dissipation level for use with low power PAs, depending on the particular application. The number of grooves in heat sink 100 controls the range of power dissipation levels from the predetermined low power dissipation level, wherein there are no attached fins, to a desired maximum power dissipation level, wherein an attached fin having a maximum height is bonded into every groove. A heat sink having a particular power dissipation level between the predetermined low and the maximum dissipation levels can be manufactured as a function of the number of attached fins used. In this manner, the higher power dissipation level heat sinks can have higher fin densities and still share a casting tool with lower power dissipation level heat sinks. In addition, the lower power dissipation level heat sinks have only those fins necessary, e.g., the fixed fins, and can, therefore, use slower, e.g., lower acoustic noise, fans because of the wider spaced fins, which have a lower back pressure.

Preferably, the attached fins are comprised of alloys that are wrought alloys that have a higher conductivity than the alloys suitable for the die casting process, e.g., the allows out of which the fixed fins are made. Specifically, the fixed fins are preferably comprised of aluminum cast alloy, ASTM 380 with a thermal conductivity of 100 W/m$^2$K, but may also be comprised of other material such as zinc, copper or magnesium. The attached fins are preferably comprised of aluminum wrought alloy, ASTM 1100 with a thermal conductivity of 222 W/m$^2$K, but may also be comprised of other material such as zinc, copper or magnesium. Moreover, not only is a heat sink having a particular power dissipation level between the predetermined low and the maximum level dependent on the number of attached fins used, it is also a function of the height of the attached fins relative to the height of the fixed fins.

Figure 2:
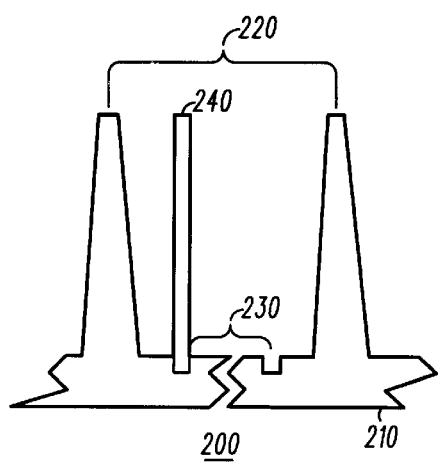
FIG. 2 illustrates a cross-sectional view of a heat sink in accordance with one embodiment of the present invention having a medium power dissipation level.
Figure 3:
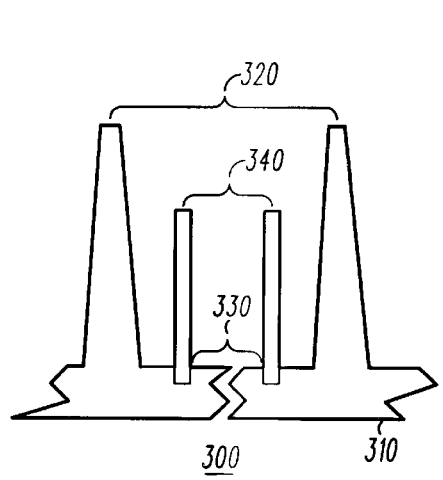
FIG. 3 illustrates a cross-sectional view of a heat sink in accordance with another embodiment of the present invention having a medium power dissipation level.
Figure 4:
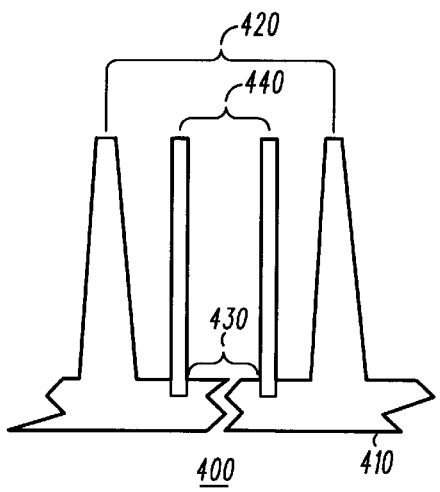
FIG. 4 illustrates a cross-sectional view of a heat sink in accordance with one embodiment of the present invention having a high power dissipation level.
Figure 5:
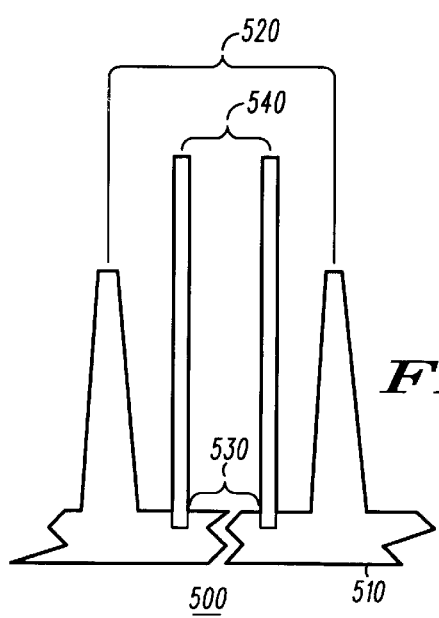
FIG. 5 illustrates a cross-sectional view of a heat sink in accordance with another embodiment of the present invention having a high power dissipation level.

Examples of heat sinks according to the present invention having varying power levels are illustrated by reference to FIGS. 2–5. These heat sinks can be constructed from the same casting tool used to construct the heat sink architecture 100 of FIG. 1. Moreover, the power dissipation levels achieved by the heat sinks illustrated in FIGS. 2–5 are a function of adding a varying number of attached fins of varying heights to the heat sink architecture 100 of FIG. 1. Accordingly, FIG. 2 and FIG. 3 illustrate heat sinks having a medium power dissipation level, and FIG. 4 and FIG. 5 illustrate heat sinks having a high power dissipation level.

FIG. 2 illustrates a cross-sectional view of a heat sink 200 in accordance with one embodiment of the present invention having a medium power dissipation level. Heat sink 200 includes a base member 210 and fixed fins 220 formed in the base member 210 and having a height that corresponds to the desired application for the heat sink. Heat sink 200 also includes grooves 230 and an attached fin 340, of about the same height as fixed fins 220, bonded into one of the grooves 230. Heat sink 200 is shown as having two fixed fins 220, two grooves 230, and one attached fin 240 merely for ease of illustration. However, it is preferred that heat sink 200 have a plurality of fixed fins 220, a plurality of attached fins 240, and a plurality of grooves 230 that are preferably equidistantly spaced. A medium power dissipation level is achieved in heat sink 200 by using less than the maximum allowable fin density, and by using attached fins 240 having about the same height as the fixed fins 230. A heat sink in accordance with this embodiment is preferably used with medium power PAs.

FIG. 3 illustrates a cross-sectional view of a heat sink 300 in accordance with another embodiment of the present invention having a medium power dissipation level. Heat sink 300 includes abase member 310 and fixed fins 320 formed in the base member 310 and having a height that corresponds to the desired application for the heat sink. Heat sink 300 also includes grooves 330 and attached fins 340, that are shorter than fixed fins 320, bonded into the grooves 330. Heat sink 300 is shown as having two fixed fins 320, two grooves 330, and two attached fins 340 merely for ease of illustration. However, it is preferred that heat sink 300 have a plurality of fixed fins 320, a plurality of attached fins 340, and a plurality of grooves 330 that are preferably equidistantly spaced. A medium power dissipation level is achieved in heat sink 300 by using the maximum allowable fin density, and by using attached fins 340 that are shorter than the fixed fins 330. A heat sink in accordance with this embodiment is preferably used with medium power PAs.

FIG. 4 illustrates a cross-sectional view of a heat sink 400 in accordance with one embodiment of the present invention having a high power dissipation level. Heat sink 400 includes a base member 410 and fixed fins 420 formed in the base member 410 and having a height that corresponds to the desired application for the heat sink. Heat sink 400 also includes grooves 430 and attached fins 340, of about the same height as fixed fins 420, bonded into the grooves 430. Heat sink 400 is shown as having two fixed fins 420, two grooves 430, and two attached fins 440 merely for ease of illustration. However, it is preferred that heat sink 400 have a plurality of fixed fins 420, a plurality of attached fins 440, and a plurality of grooves 430 that are preferably equidistantly spaced. A high power dissipation level is achieved in heat sink 400 by using the maximum allowable fin density, and by using attached fins 440 having about the same height as the fixed fins 430. A heat sink in accordance with this embodiment is preferably used with high power PAs.

FIG. 5 illustrates a cross-sectional view of a heat sink 500 in accordance with another embodiment of the present invention having a high power dissipation level. Heat sink 500 includes a base member 510 and fixed fins 520 formed in the base member 510 and having a height that corresponds to the desired application for the heat sink. Heat sink 500 also includes grooves 530 and attached fins 540, that are taller than fixed fins 520, bonded into the grooves 530. Heat sink 500 is shown as having two fixed fins 520, two grooves 530, and two attached fins 540 merely for ease of illustration. However, it is preferred that heat sink 500 have a plurality of fixed fins 520, a plurality of attached fins 540, and a plurality of grooves 530 that are preferably equidistantly spaced. A high power dissipation level is achieved in heat sink 500 by using the maximum allowable fin density, and by using attached fins 540 that are taller than the fixed fins 530. A heat sink in accordance with this embodiment is preferably used with high power PAs.

One advantage of the present invention is that cost is only added as needed. The low power die-casting is used as is, with no additional and costly operations, thereby, making overweight and costly die-casting unnecessary for lower power products. Only the higher power products require the most costly operations, which can be absorbed into the cost of these products. Moreover, the lower power heat sinks require less fan capability, so the fans can be smaller, cheaper and quieter.

Another advantage of the present invention is that a single casting tool can be used for a range of PA power dissipation levels, thus reducing part cost. Higher power heat sinks can have high fin densities and still share a tool with low power heat sinks, and low power heat sinks can be lighter and less costly. Thus, the single die cast part is very flexible with regards to the power level for which it can be used because a wide range of power dissipation levels can be achieved by simply varying the number and length of attached fins, and the cost of the die tool can be more easily spread over a portfolio of heat sink products.

Yet another advantage of the present invention is that a casting tool for manufacturing heat sinks according to the present invention is simpler and more robust because of the low fixed fin density due to the wide spacing between the fixed fins. This decreases the cost of the tool, as it is easier to manufacture and longer lasting.

Still another advantage is that heat sinks according to the present invention can be manufactured having a higher fin density than can be achieved using the prior art casting-only method. Moreover, low power heat sinks according to the present invention can be manufactured at a much lower cost than low power heat sinks manufactured using the prior art bonding-only method.

Another advantage of the present invention is that the use of one casting footprint for all power levels leads to design standardization and increased reuse of modules that are mounted to the heat sink. These modules include splitters, combiners, RF device modules and circulators. Moreover using the same tool across a portfolio of heat sink products standardizes tolerance, so that if there are any problems during the casting process you only have to fix them at one point.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

What is claimed is:

1. A heat sink for use with a heat generating device, comprising:
    a base member;
    a fixed set of at least three adjacent heat dissipating surfaces formed in said base member for causing said heat sink to have a predetermined low power dissipation level that is a function of the number of heat dissipating surfaces in said fixed set, each said heat dissipating surface being perpendicular to said base member;
    at least one groove formed in said base member between each two adjacent heat dissipating surfaces in said fixed set for enabling an additional individual heat dissipating surface to be securely attached perpendicular to said base member in each said groove for enabling said heat sink to have a plurality of power dissipation levels that are in excess of said predetermined low power dissipation level as a function of the number of additional individual heat dissipating surfaces attached to said base member; and
    at least one additional individual heat dissipating surface attached perpendicular to said base member in one said groove for causing said heat sink to have a plurality of power dissipation levels that are in excess of said predetermined low power dissipation level as a function of the number of additional individual heat dissipating surfaces attached to said base member.

2. The heat sink of claim 1, wherein each heat dissipating surface in said fixed set is of a first height and each additional individual attached heat dissipating surface is of a second height.

3. The heat sink of claim 2, wherein said first height is greater than said second height.

4. The heat sink of claim 2, wherein said first height is about the same as said second height.

5. The heat sink of claim 1, wherein each heat dissipating surface in said fixed set is comprised of a first material and each additional individual attached heat dissipating surface is comprised of a second material that is of a higher thermal conductivity than said first material.

6. A heat sink for use with a heat generating device, comprising:
    a base member;
    a fixed set of adjacent heat dissipating surfaces formed in said base member for causing said heat sink to have a predetermined low power dissipation level that is a function of the number of heat dissipating surfaces in said fixed set, each said heat dissipating surface being perpendicular to said base member;
    at least one groove formed in said base member between each two adjacent heat dissipating surfaces in said fixed set for enabling an additional heat dissipating surface to be securely attached perpendicular to said base member in each said groove for enabling said heat sink to have a power dissipation level that is in excess of said predetermined low power dissipation level as a function of the number of additional heat dissipating surfaces attached to said base member; and
    at least one additional heat dissipating surface attached perpendicular to said base member in one said groove, wherein each heat dissipating surface in said fixed set is of a first height and each additional attached heat dissipating surface is of a second height and said first height is less than said second height.

* * * * *